US006495477B2

(12) United States Patent
Taylor et al.

(10) Patent No.: US 6,495,477 B2
(45) Date of Patent: Dec. 17, 2002

(54) METHOD FOR FORMING A NITRIDIZED INTERFACE ON A SEMICONDUCTOR SUBSTRATE

(75) Inventors: Jonathan J. Taylor, Austin, TX (US); David F. Jendresky, Austin, TX (US)

(73) Assignee: Samsung Austin Semiconductor, LLC, Austin, TX (US)

( * ) Notice: Subject to any disclaimer, the term of this patent is extended or adjusted under 35 U.S.C. 154(b) by 0 days.

(21) Appl. No.: 09/862,348

(22) Filed: May 21, 2001

(65) Prior Publication Data

US 2001/0044222 A1 Nov. 22, 2001

Related U.S. Application Data

(63) Continuation of application No. 09/299,969, filed on Apr. 26, 1999, now abandoned.

(51) Int. Cl.[7] .................... H01L 21/31; H01L 21/469
(52) U.S. Cl. ..................................... 438/775; 438/791
(58) Field of Search ............................ 438/292, 362, 438/410, 418, 425, 433, 763, 775, 776, 791, 792

(56) References Cited

U.S. PATENT DOCUMENTS

| | | | |
|---|---|---|---|
| 4,764,248 A | 8/1988 | Bhattacherjee et al. | 156/643 |
| 4,897,364 A | 1/1990 | Nguyen et al. | 437/69 |
| 5,264,396 A | 11/1993 | Thakur et al. | 437/238 |
| 5,382,533 A | 1/1995 | Ahmad et al. | 437/24 |
| 5,397,732 A | 3/1995 | Chen | 437/69 |
| 5,437,765 A | 8/1995 | Loewenstein | 216/51 |
| 5,449,433 A | 9/1995 | Donohoe | 156/643.1 |
| 5,712,177 A | 1/1998 | Kaushik et al. | 437/42 |
| 5,714,398 A | 2/1998 | Chao et al. | 437/41 SM |
| 5,741,396 A | 4/1998 | Loewenstein | 156/643.1 |
| 5,804,493 A | 9/1998 | Juang et al. | 438/440 |
| 5,930,655 A | 7/1999 | Cooney, III et al. | 438/474 |

FOREIGN PATENT DOCUMENTS

| | | |
|---|---|---|
| EP | 0283306 A2 | 9/1988 |
| JP | 6350079 | 12/1994 |
| JP | 9134914 | 5/1997 |
| JP | 9321025 | 12/1997 |
| WO | WO91/00615 | 1/1991 |

OTHER PUBLICATIONS

Chang et al., "Improved planarazation techniques applied to a low dielectric constant polyimide used in multilevel metal Ics (invited paper)," Motorola Advanced Technology Center, San Jose, CA, USA, Sep. 12, 1991.

Chiu et al., "A bird's beak free local oxidation technology feasible for VLSI circuits fabrication," *IEEE Transactions on Electron Devices*, 29(4):536–540, Apr. 1982.

Lee et al., "Ta and TaN adhesion to high–temperature fluorinated polyimides. Surface and interface chemistry," *J. of Adhesion Sci. and Tech.*, 12:773–790, 1998.

Liehr, "In–situ characterization of $SiO_2$ deposition and growth for gate–oxides," *SPIE, Rapid Thermal and Integrated Processing*, 1595:166–176, 1991.

Morosoff et al., "Plasma polymerization of tetrafluoroethylene. III. capacitive audio frequency (10 kHz) and AC discharge," *J. of Applied Polymer Science*, 23:3471–3488, 1979.

Wolf, "Silicon Processing for the VLSI Era. vol. 2: Process Integration, Chapter 2, Isolation Technologies for Integrated Circuits," Lattice Press: Sunset Beach, CA, pp. 12–41, 1990.

*Primary Examiner*—George C. Eckert, II
*Assistant Examiner*—Ginette Peralta
(74) *Attorney, Agent, or Firm*—Akin, Gump, Strauss, Hauer & Feld, LLP

(57) ABSTRACT

A surface treatment method for forming a fluorine-doped nitridized interface on a semiconductor substrate. The fluorine-doped nitridized interface may be formed using an ammonia plasma CVD process having a treatment gas doped with a fluorine component, such as carbon hexafluorine. The method may be employed as part of a LOCOS-based processing scheme in the manufacture of MOS semiconductor devices, such as DRAM devices.

12 Claims, 8 Drawing Sheets

Standard NH₃ Plasma
Range = 6.65 Ang

Flat Reactor Center

● GOF Error
▲ Sigma Error
■ Measurement Error
– Below Calculated Mean
+ Above Calculated Mean C₂F₆ Doped NH₃ Plasma
Range = 1.39 Ang Flat Reactor Center ● GOF Error
▲ Sigma Error
■ Measurement Error
− Below Calculated Mean
+ Above Calculated Mean

METHOD FOR FORMING A NITRIDIZED INTERFACE ON A SEMICONDUCTOR SUBSTRATE

CROSS-REFERENCE TO RELATED APPLICATIONS

This application is a continuation of U.S. patent application Ser. No. 09/299,969, filed Apr. 26, 1999, now abandoned. The above noted application is hereby incorporated by reference herein in their entireties.

BACKGROUND OF THE INVENTION

1. Field of the Invention

This invention relates to a method for forming a nitridized interface on a substrate, and more particularly to improving uniformity of an ammonia plasma surface treatment on a semiconductor substrate. Specifically, this invention relates to forming a nitridized polysilicon interface using ammonia plasma doped with fluorine.

2. Description of Related Art

Silicon nitride films are commonly employed in the fabrication of circuits for use in modern semiconductor devices, such as the fabrication of metal-oxide semiconductor ("MOS") devices for high density integrated circuits and submicron designs. For example, silicon nitride films are employed in the manufacture of MOS devices using Local Oxidation of Silicon processes ("LOCOS"), as well as advanced LOCOS methods such as polysilicon buffered LOCOS processes ("PBLOCOS"). Further information on LOCOS-based processing technology may be found in Wolf.

In a LOCOS manufacturing method, a pad of native oxide is typically formed on a semiconductor substrate for purposes of cushioning transition of stress between a silicon substrate and a silicon nitride film, which is deposited to serve as an oxidation mask. Such pad oxides may be thermally-grown or deposited using chemical vapor deposition ("CVD"). In a PBLOCOS method, a thin pad layer of thermally deposited silicon dioxide ($SiO_2$) in combination with a polysilicon buffer layer is formed. PBLOCOS methods are typically utilized to enhance suppression of lateral oxidation and to provide a stress buffer layer between the oxide layer and a subsequently deposited silicon nitride layer.

In a typical LOCOS-based process, silicon nitride and polysilicon buffer layers (when present) are removed selectively to expose those areas where field oxide growth is desired, leaving the active areas of the device covered. Field oxide is then grown "locally" in the etched areas between the active areas covered by silicon nitride film to isolate them from each other. It is desirable to minimize the space required for these isolation zones, as they consume valuable semiconductor space.

It is at the time of field oxide growth that encroachment of oxide into the silicon substrate and interface area between the surrounding silicon nitride and polysilicon buffer layer (if present) typically occurs. This oxide encroachment is commonly referred to as a "first bird's beak" when it extends into the substrate, and as a "second bird's beak" when it occurs in the interface of the silicon nitride and polysilicon. Bird's beak formation can change the active area size and potentially cause gate poly bridging. First bird's beak areas consume additional space as they extend beyond the edges of the isolation zones, and work against the achievement of isolation requirements for submicron devices. Second bird's beak areas tend to interfere with removal of polysilicon in a LOCOS-based process, leaving undesirable "stringers" of poly which may cause shorts and/or leakage. Following field oxide growth, the remainder of the silicon nitride layer and any buffer layer present underneath is typically removed in order that the active areas of the semiconductor device may be formed.

Substrate surfaces are typically nitridized using a CVD process such as ammonia-plasma CVD. During surface nitridization in a plasma enhanced CVD reactor, flow of reactant gasses, as well as reacted byproducts, typically results in nonuniform film thickness. Nonuniformity of treatment may be gauged or measured in terms of both film within wafer thickness nonuniformity, and in wafer to wafer nonuniformity. Film within wafer thickness nonuniformity may be expresses in terms of percentage standard deviation. Wafer to wafer nonuniformity typically averages from about 6 Å to about 10 Å.

Increased film nonuniformity typically results in increased second bird's beak formation. Such variations in film treatment tend to decrease wafer yield by increasing the second bird's beak size, leading to poly stringer formation and reduced process capability as measured on a test wafer run with the product. Process capability is defined as the process spec width divided by ($6\epsilon$), and is typically expressed as $C_p$ or $C_{pk}$.

As an example of problems encountered with conventional LOCOS-based processes, FIG. 1 illustrates field oxide 18 formed on a semiconductor substrate 10 in isolation area 11, using a conventional LOCOS-based process known in the art. As shown in FIG. 1, isolation area 11 is defined between active device areas 13. Active device areas 13 are covered by silicon dioxide pad layer 12, polysilicon buffer layer 14 and silicon nitride layer 16. As may be seen in FIG. 1, field oxide 18 extends into active areas 13 due to encroachment of oxide 18 into the substrate 10, forming "first bird's beak" areas 17, and between silicon nitride layer 16 and polysilicon buffer layer 14, forming "second bird's beak" areas 19. Upon subsequent removal of layers 16, 14 and 12, residual areas of polysilicon buffer layer 14 may remain between the "bird's beak" areas 17 and 19, which tends to act as a mask against removal of polysilicon. These residual polysilicon areas are referred to as "poly stringers" and are undesirable due to their tendency to cause shorts and leakage.

SUMMARY OF THE INVENTION

Using the disclosed method, a fluorine doped nitride surface treatment may be employed to form a fluorine-doped nitridized substrate interface. Benefits of the disclosed method include, but are not limited to, reduction in nonuniformity of nitridized substrate surfaces and wafer to wafer nonuniformity, as well as the provision of a more stable process. By increasing uniformity of substrate nitridization, wafer yield may be increased over conventional undoped ammonia plasma treatment processes by, for example, substantially eliminating across-wafer nonuniformity and the presence of a "second bird's beak" in the field oxide edge areas formed in a LOCOS-based process. Advantageously, in one embodiment of the disclosed method, process capability ($C_p$, $C_{pk}$) is increased because of this reduction in thickness variation, and/or formation of poly stringers is suppressed or substantially prevented.

While not wishing to be bound by theory, it is believed that lateral oxidation of the poly/nitride interface during field oxidation is prevented by tying up available Si atoms at the surface of the poly. This is believed to result due to the breaking of stressed Si—O—Si bonds at the polysilicon surface by HF formation and surface reaction, direct F reaction, and/or bombardment. When this occurs, Si—O—Si bonds are believed to be replaced by Si—F, non-bridging Si—O, and/or Si—N bonds. Formation of Si—N bonds is believed to be the predominate reaction, and it is believed that these bonds create a more uniform interface between a polysilicon layer and a subsequent silicon nitride layer. Furthermore, fluorine is also believed to break Si—H bonds and Si—OH bonds which may form in $NH_3$ plasma, thus tending to form stronger Si—F bonds. It is believed that one or more of the previously described mechanisms retard lateral diffusion and reaction of oxygen during field oxide growth, thus yielding better uniformity.

In one embodiment of the disclosed method, a source of fluorine, typically carbon hexafluorine, $C_2F_6$ (Halocarbon-116), is introduced into an ammonia plasma to nitridize a substrate surface (such as oxide or polysilicon) in a LOCOS-based process, for example, a LOCOS or PBLOCOS isolation scheme. LOCOS-based processes are known in the art and are described, for example, in Wolf, Stanley *Silicon Processing for the VLSI Era, Volume 2—Process Integration*, Lattice Press, Sunset Beach, Calif., pp. 12–41, 1990, which is incorporated herein by reference.

In one embodiment, $C_2F_6$ gas (typically employed as an etchant) is introduced into an ammonia plasma during nitride surface treatment of polysilicon. In this embodiment, addition of fluorine-based dopant may surprisingly be used to reduce film within wafer thickness nonuniformity to less than or equal to about 2 Å (or about 1σ), as measured on a test wafer, resulting in reduction in wafer to wafer nonuniformity and providing a more stable process.

Advantages of the disclosed method may be realized in any semiconductor fabrication surface treatment process employing silicon nitride. For example, the disclosed method may be employed in the manufacture of MOS semiconductor devices on a silicon substrate including, but not limited to, manufacture of DRAM devices.

In one respect, disclosed is a method of nitridizing the surface of a semiconductor substrate, including forming a fluorine-doped nitridized surface on an upper surface of the substrate, such that an interface is defined between the fluorine-doped nitridized surface and the substrate surface. The forming may include exposing the substrate surface to a treatment gas including a fluorine component and a nitrogen component; such that the exposure results in the formation of a fluorine-doped nitridized surface having an interface with the substrate surface. The substrate surface may include silicon dioxide or polysilicon. In one embodiment, the nitrogen component may be at least one of ammonia, nitrogen, or a mixture thereof; the fluorine component may be at least one of $C_2H_6$, $C_3F_8$, $CF_4$, or a mixture thereof; and the exposing may occur in a chemical vapor deposition process. In another embodiment, the nitrogen component may be ammonia; the fluorine component may be carbon hexafluorine; and the exposing may occur in a low pressure plasma enhanced chemical vapor deposition process. The fluorine-doped nitridized surface may include a film may have a thickness of at least about 1 Å to about is 40 Å, alternatively from about 10 Å to about 30 Å. The fluorine-doped nitridized surface may be formed using a treatment gas including a volume ratio of carbonhexafluorine to ammonia of from about 1:1 to about 1:20.

The method may further include exposing the fluorine-doped nitridized surface to an undoped treatment gas including a nitrogen component; such that the exposure results in the formation of an undoped nitridized surface on the fluorine-doped nitridized surface. In such a case, the nitrogen component of the fluorine doped treatment gas may be ammonia; the fluorine component of the fluorine-doped treatment gas may be carbon hexafluorine; the nitrogen component of the undoped treatment gas may be ammonia; and the exposing to the fluorine-doped treatment gas and the exposing to the undoped treatment gas each may occur in a respective low pressure plasma enhanced chemical vapor deposition process. The fluorine-doped nitridized surface may include a film may have a thickness of from about 1 Å to about 40 Å; and the undoped nitridized surface may include a film may have a thickness of from about 700 Å to about 3000 Å. The substrate may include a semiconductor wafer, and an upper surface of the undoped nitridized surface may have a within wafer thickness variation of less than about 2 Å.

In another respect, disclosed are MOS semiconductor devices (such as DRAM memory devices), and methods for forming localized field oxide during fabrication of such devices on a substrate having a silicon dioxide pad layer present on an upper surface of the substrate and a polysilicon buffer layer disposed on an upper surface of the silicon dioxide pad layer, including forming a fluorine-doped nitridized surface on an upper surface of the polysilicon buffer layer; such that an interface is defined between the fluorine-doped nitridized surface and the upper surface of the polysilicon buffer layer; forming an undoped nitridized surface on the fluorine-doped nitridized surface, the undoped nitridized surface and the fluorine-doped nitridized surface together forming a silicon nitride layer; defining at least one active region pattern on the silicon nitride layer; removing the silicon nitride and the polysilicon buffer layers in an area outside the active region pattern; and forming a field oxide region in the area where the silicon nitride layer and polysilicon buffer layers have been removed. The formation of a fluorine-doped nitridized surface may include exposing the upper surface of the polysilicon buffer layer to a treatment gas including a mixture of carbon hexafluorine and ammonia in a low pressure plasma enhanced chemical vapor deposition process. The formation of an undoped nitridized surface may include exposing the fluorine-doped nitridized surface to a treatment gas including ammonia and substantially no fluorine component in a low pressure plasma enhanced chemical vapor deposition process. The fluorine-doped nitridized surface may include a film may have a thickness of at least about 10 Å to about 30 Å, alternatively from about 20 Å to about 25 Å. The undoped nitridized surface may have a thickness of from about 700 Å to about 3000 Å, alternatively from about 1200 Å to about 1800 Å. The fluorine-doped nitridized surface may be formed using a treatment gas including a volume ratio of carbonhexafluorine to ammonia of from about 1:3 to about 1:20. The substrate may include a semiconductor wafer, and an upper surface of the undoped silicon nitride layer may have a within wafer thickness variation of less than about 2 Å. In one embodiment, encroachment of oxide into the interface defined between the fluorine-doped nitridized surface and the upper surface of the polysilicon buffer layer may be inhibited or substantially prevented during formation of the field oxide region.

In another respect, disclosed are MOS semiconductor devices (such as DRAM memory devices), and methods for forming localized field oxide during fabrication of such devices on a silicon substrate, including forming a pad layer of silicon dioxide on the silicon substrate; forming a buffer layer of polysilicon on the silicon dioxide pad layer, the pad layer of silicon dioxide being disposed between the buffer layer of polysilicon and the silicon substrate; forming a fluorine-doped nitridized surface on an upper surface of the polysilicon buffer layer; wherein an interface may be defined between the fluorine-doped nitridized surface and the upper surface of the polysilicon buffer layer; forming an undoped nitridized surface on the fluorine-doped nitridized surface, the undoped nitridized surface and the fluorine-doped nitridized surface together forming a silicon nitride layer; defining at least one active region pattern on the silicon nitride layer, removing the silicon nitride layer and the polysilicon buffer layer in the area outside the active region pattern; and forming a field oxide region on the silicon substrate in the area where the silicon nitride layer and polysilicon buffer layers have been removed. Formation of a fluorine-doped nitridized surface may include exposing the upper surface of the polysilicon buffer layer to a treatment gas including a mixture of carbon hexafluorine and ammonia in a low pressure plasma enhanced chemical vapor deposition process; and formation of an undoped nitridized surface may include exposing the fluorine-doped nitridized surface to a treatment gas including ammonia and substantially no fluorine component in a low pressure plasma enhanced chemical vapor deposition process. In one embodiment, a fluorine-doped nitridized surface-may include a film may have a thickness of from about 20 Å to about 25 Å, and/or an undoped nitridized surface may have a thickness of from about 1200 Å to about 1800 Å. The fluorine-doped nitridized surface may be formed using a treatment gas including a volume ratio of carbonhexafluorine to ammonia of from about 1:3 to about 1:15. Using one embodiment of this method, an upper surface of the silicon nitride layer surface may have a within wafer thickness variation of less than about 2 Å. In another embodiment, encroachment of oxide into the interface defined between the fluorine-doped nitridized surface and the upper surface of the polysilicon buffer layer may be inhibited or substantially prevented during the formation of the field oxide region.

DESCRIPTION OF ILLUSTRATIVE EMBODIMENTS

Figure 1:
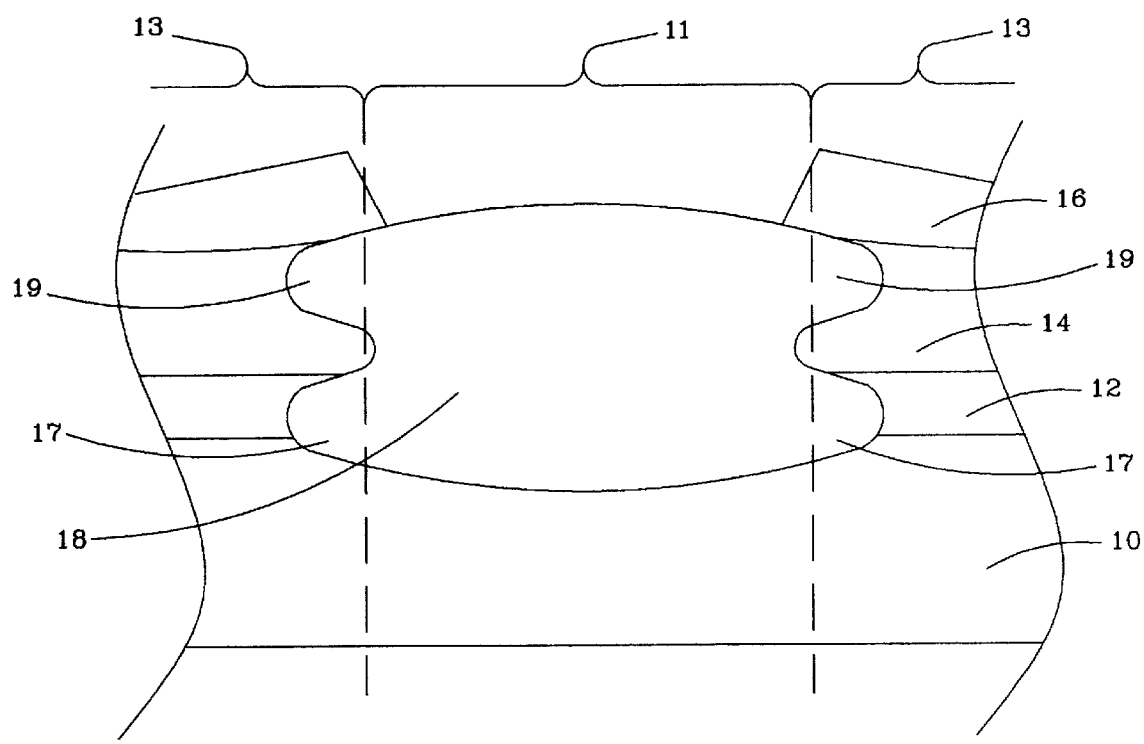
FIG. 1 is a simplified partial cross-sectional view of a semiconductor substrate showing field oxide regions formed using a conventional LOCOS-based process, and exhibiting first and second "bird's beak" oxide encroachment beneath adjacent silicon nitride mask layers.

A fluorine-doped nitridized interface may be formed on a substrate surface using any method suitable for treating a substrate surface including, but not limited to, CVD. In one embodiment, fluorine-doped ammonia plasma may be used to treat a polysilicon surface using a CVD process. In this regard, any CVD-based method suitable for nitride surface treating may be employed including, but not limited to, plasma enhanced CVD ("PECVD"), non-plasma enhanced CVD, radiant energy CVD, low pressure CVD ("LPCVD"), atmospheric CVD, etc. It will be understood with benefit of the disclosed method that the term "CVD" also includes any possible combination of CVD types, for example, low pressure plasma enhanced chemical vapor deposition. Suitable equipment includes any CVD equipment suitable for nitride surface treatment of substrate surfaces. Examples include, but are not limited to, commercially available from suppliers such as is Novellus, Applied Materials, Genus, etc. Particular examples include, but are not limited to, equipment available from Novellus (e.g., "CONCEPT II"), Applied Materials (e.g., "P5000", "CENTURA"), and Matson.

A fluorine-doped nitride surface treatment may be performed using any CVD treatment gas mixture suitable for supplying nitrogen and fluorine components to form a nitridized interface with a substrate surface. For example, suitable nitrogen gas components include, but are not limited to, at least one of ammonia, nitrogen, or a mixture thereof. Suitable fluorine gas components include, but are not limited to, at least one of carbon hexafluorine ($C_2H_6$), $C_3F_8$, carbon tetrafluoride ($CF_4$), or a mixture thereof.

In one embodiment of the disclosed method, uniformity of a nitride surface treatment may be improved by using a fluorine-doped ammonia plasma to form a fluorine-doped nitridized interface with a substrate surface. Fluorine-doped ammonia plasma of the disclosed method may be advantageously employed in any semiconductor manufacturing method which utilizes ammonia plasma surface treatments.

For example, fluorine-doped ammonia plasma may be employed in the manufacture of MOS devices such as logic devices, microprocessors or memory devices including DRAMs, SRAMs, and ROMs. In one specific example, a fluorine-doped silicon nitride layer may be formed by a low pressure plasma enhanced chemical vapor deposition process using a treatment gas comprising a mixture of ammonia and carbon hexafluorine ($C_2H_6$, or "Halocarbon-116").

Fluorine and nitrogen gas components may be present in a CVD treatment gas in any amount suitable for forming a fluorine-doped nitridized interface. In one exemplary embodiment of the disclosed method, a volume ratio of carbon hexafluorine to ammonia of from about 1:1 to about 1:20, alternatively from about 1:3 to about 1:20, alternatively from about 1:3 to about 1:15, alternatively from about 1:5 to about 1:15, alternatively from about 1:7 to about 1:15, and further alternatively about 1:10, may be employed. However ratios greater than about 1:20, and less than about 1:5 are also possible. A treatment gas may optionally include other components if so desired. In this regard, any other CVD gas components known in the art to be suitable for use in the formation of silicon nitride films may be employed including, but not limited to, nitrogen. In those cases where other gas components are present, it will be understood that carbon hexafluorine and ammonia may be present in the ratios described above, with ammonia and other gas constituents, such as nitrogen, making up the remainder of the treatment gas volume.

An undoped second nitride surface treatment may be performed following creation of a fluorine-doped nitridized interface with a fluorine doped first nitride surface treatment. With benefit of this disclosure, such an undoped nitride surface treatment may be performed using any suitable methods known in the art, including CVD methods described elsewhere herein. As used herein in relation to treatment gas composition or film composition, "undoped" means containing substantially no fluorine atom content, and "fluorine-doped" means containing sufficient fluorine atom content to result in or to form a nitridized interface with a substrate surface that inhibits or substantially prevents formation of a second bird's beak as described elsewhere herein.

In one embodiment, a fluorine-doped nitridized interface may be formed on a substrate during a first nitride surface treatment by using a CVD treatment gas containing both fluorine and nitrogen components. In this regard, exposure to a fluorine component need only be of sufficient duration to create a fluorine-doped nitridized interface on a substrate surface that is capable of retarding or preventing lateral diffusion and reaction of oxygen at the nitridized interface during, for example, field oxide growth in a LOCOS-based process. An undoped second nitride surface treatment may follow the first treatment, and may be performed using an undoped CVD treatment gas having a nitrogen component, such as ammonia. In one embodiment, such a second treatment is performed in a separate step, for example, in a separate reactor or in the same reactor after reconfiguration for processing with the undoped treatment gas mixture. Alternatively, when a substrate surface has been sufficiently exposed to a fluorine doped CVD treatment gas so as to form a fluorine-doped nitridized interface of desired characteristics, the fluorine component of the treatment gas may be shut off, with processing continuing with a treatment gas containing a nitrogen component. The latter case may be possible, for example, using a reactor system in which stoichiometrically correct amounts of treatment gas components may be supplied for both doped and undoped treatment steps. Such a reactor system includes, for example, a Novellus "CONCEPT II".

When using the disclosed fluorine-doped nitride surface treatment to form a nitridized interface on a substrate surface, an associated fluorine-doped nitride film may be formed. It will be understood with benefit of this disclosure that as long as a fluorine-doped nitridized interface is formed on the surface, the thickness of an accompanying fluorine-doped nitride film may vary as desired. In one exemplary embodiment for the fabrication of MOS devices using LOCOS-based processing, overall thickness of a fluorine-doped nitride film layer formed on a polysilicon surface may be from about 1 Å to about 40 Å, alternatively from about 10 Å to about 30 Å, alternatively from about 20 Å to about 25 Å, and further alternatively about 23 Å. However, it will be understood that film thicknesses greater that about 40 Å or less than about 1 Å are also possible.

FIGS. 2–9 illustrate formation of field oxide on a substrate using one exemplary embodiment of the disclosed method in which a PBLOCOS process is employed with a fluorine doped nitride surface treatment of the polysilicon buffer layer. Although a PBLOCOS process utilizing a polysilicon buffer layer is illustrated, it will be understood with benefit of the present disclosure that the benefit of a fluorine-doped nitride surface treatment may be realized when used in other processes and to when used to treat other substrate surfaces, for example, to treat a surface of a silicon dioxide layer in a LOCOS-based process.

Figure 2:
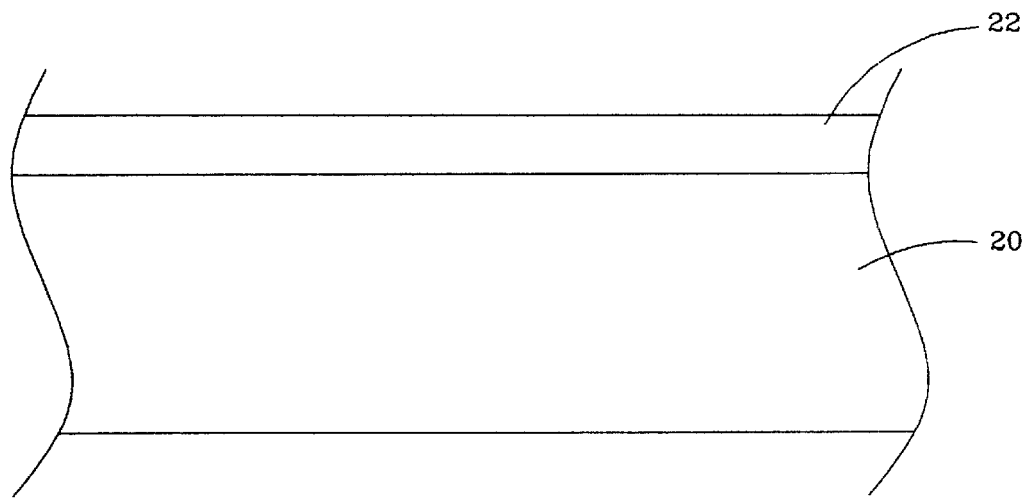
FIG. 2 is a simplified partial cross-sectional view of a semiconductor substrate with a pad oxide layer formed thereupon according to one embodiment of the disclosed method.

In FIG. 2, a silicon dioxide pad layer 22 has been formed on substrate 20. Pad layer 22 may be formed to a desired thickness using any suitable method known in the art. For example, pad layer 22 may be thermally grown, or deposited by CVD. In one embodiment, pad layer 22 may have a thickness of from about 50 Å to about 250 Å, alternatively about 160 Å, although thicknesses greater than about 250 Å and less than about 50 Å are also possible. As used herein, "substrate" means any semiconductor substrate including, but not limited to, a semiconductor wafer substrate such as silicon or GaAs. It will be understood that a "substrate" may include, among other things, a semiconductor wafer or a semiconductor wafer having various process layers formed on the wafer. As used herein, "layer" may be used interchangeably with "film".

Figure 3:
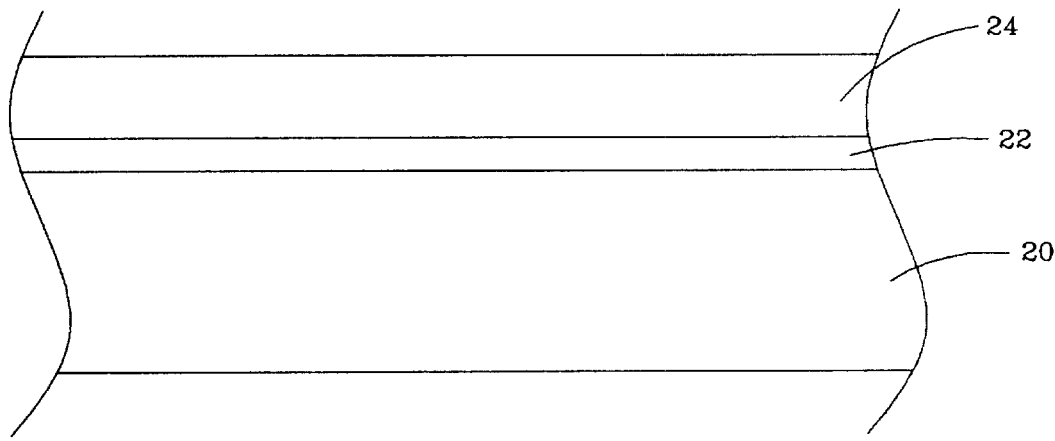
FIG. 3 is a simplified partial cross-sectional view of a semiconductor substrate with a pad oxide layer and polysilicon buffer layer formed thereupon according to one embodiment of the disclosed method.

Referring now to FIG. 3, a polysilicon buffer layer 24 is shown deposited on pad oxide layer 22. Polysilicon buffer layer 24 may be formed using any suitable method known in the art using a CVD process. In one embodiment, buffer layer 24 may have a thickness of from about 200 Å to about 1000 Å, alternatively about 700 Å, although thicknesses greater than about 200 Å and less than about 1000 Å are also possible.

Figure 4:
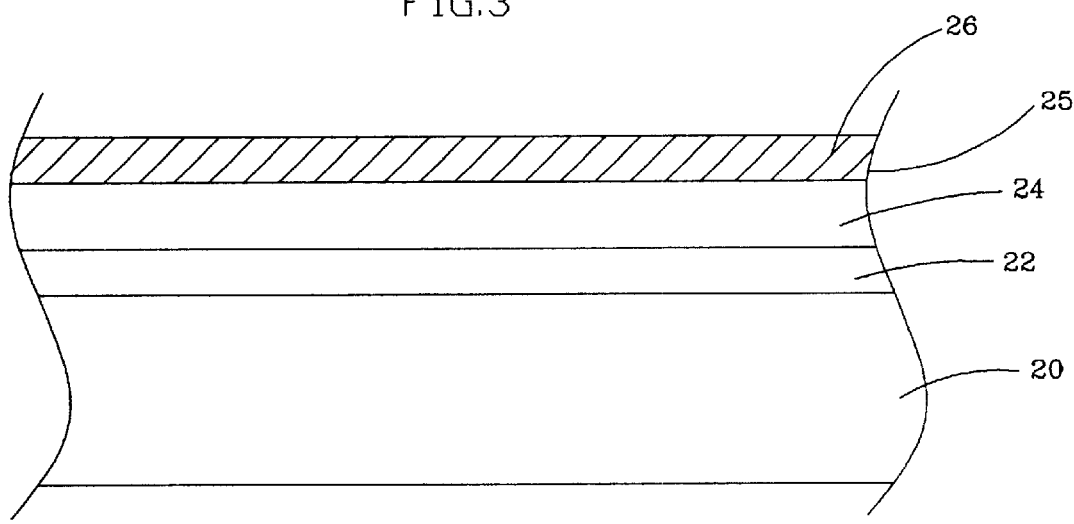
FIG. 4 is a simplified partial cross-sectional view of a semiconductor substrate with a pad oxide layer, polysilicon buffer layer, fluorine-doped nitridized polysilicon interface and fluorine-doped silicon nitride film formed thereupon according to one embodiment of the disclosed method.

In FIG. 4, polysilicon layer 24 has been exposed to a fluorine-doped nitride surface treatment, for example a low pressure fluorine-doped ammonia plasma CVD process, to form fluorine-doped nitridized polysilicon interface 25. As shown in FIG. 4, fluorine-doped nitride film 26 has also been formed as a result of the surface treatment. In this embodiment, fluorine-doped film 26 may be formed to a thickness from about 1 Å to about 40 Å, alternatively from about 10 Å to about 30 Å, alternatively from about 20 Å to about 25 Å, and further alternatively about 23 Å, using a treatment gas comprising a mixture of carbon hexafluorine and ammonia. In this regard, flow rate of carbon hexafluorine may be controlled to achieve a treatment gas having a relative volume or ratio of carbon hexafluorine to ammonia as described elsewhere herein. For example, in a Novellus "CONCEPT II" reactor, flow rate of carbon hexafluorine may range from about 1 standard cubic centimeters per minute (sccm) to about 300 sccm, alternatively from about 20 sccm to about 200 sccm, alternatively from about 20 sccm to about 100 sccm, alternatively from about 20 to about 40 sccm, and further alternatively about 30 sccm; and simultaneous flow rate of ammonia may range from about 100 sccm to about 3000 sccm, alternatively from about 100 sccm to about 500 sccm, alternatively from about 200 sccm to about 400 sccm, and further alternatively about 300 sccm.

Figure 5:
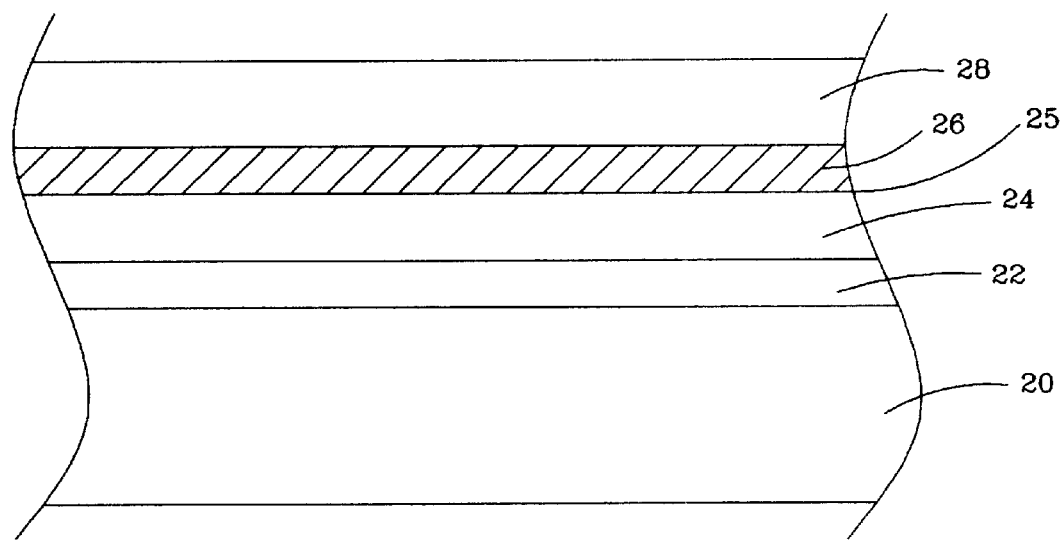
FIG. 5 is a simplified partial cross-sectional view of a semiconductor substrate with an oxide pad layer, polysilicon buffer layer, fluorine-doped nitridized polysilicon interface, fluorine-doped silicon nitride film and undoped silicon nitride film according to one embodiment of the disclosed method.

Following fluorine-doped surface treatment of polysilicon layer 24, a conventional nitride surface treatment may be performed, either in a separate reactor and/or processing step, or in the same reactor by terminating flow of carbon hexafluorine. As shown in FIG. 5, conventional nitride surface treatment with undoped ammonia plasma results in formation of undoped silicon nitride film 28 on top of fluorine-doped nitride film 26. Thickness of film 28 may vary relative to film 26 as described elsewhere herein. In one exemplary embodiment, undoped nitride film 28 may be formed to a thickness of from about 700 Å to about 3000 Å, alternatively from about 1200 Å to about 1800 Å, and further alternatively about 1550 Å.

Figure 6:
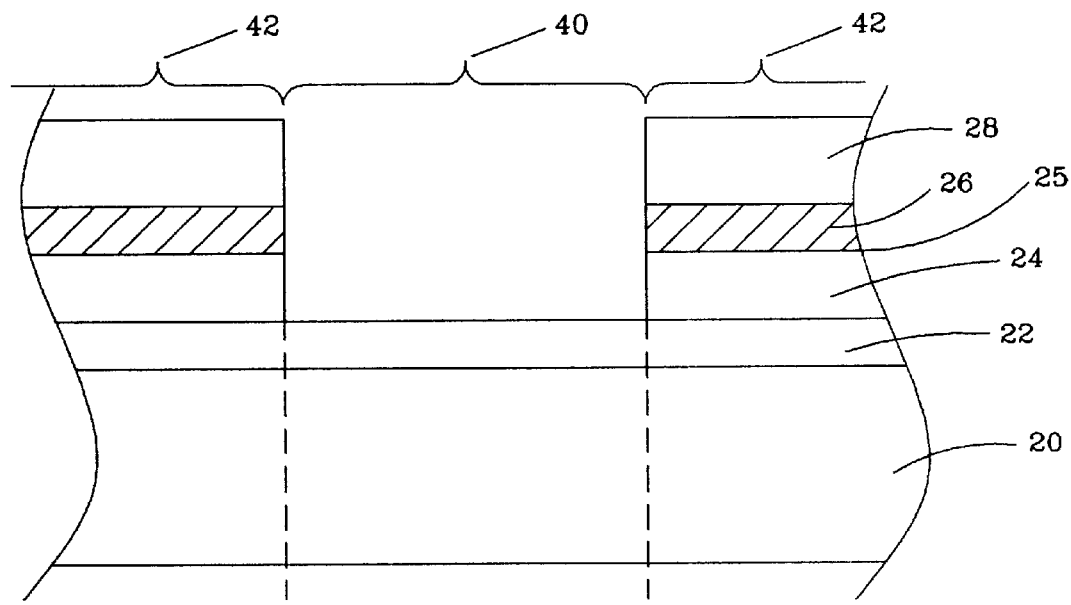
FIG. 6 is a simplified partial cross-sectional view of a semiconductor substrate of FIG. 5 with doped and undoped silicon nitride films and polysilicon buffer layers removed in preparation for forming field oxide regions according to one embodiment of the disclosed method.

Following nitride surface treatments, active region patterns 42 may be defined on upper surface of silicon nitride layer 30, typically using photoresist. In this regard, any photolithographic or other suitable method for forming a pattern of active device areas may be employed. As shown in FIG. 6, after photoresist is applied silicon nitride film layers 26 and 28 may be removed along with polysilicon buffer layer 24, for example, by anisotropic etching to form field oxide area 40 between active areas 42.

Figure 7:
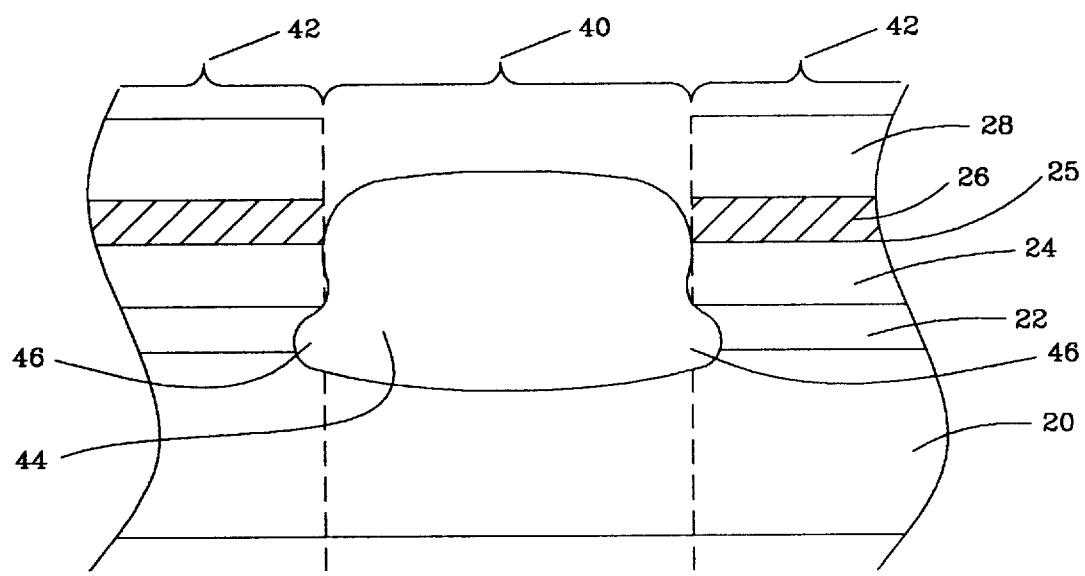
FIG. 7 is a simplified partial cross-sectional view of a semiconductor substrate of FIG. 6 showing a field oxide region grown in the area where doped and undoped silicon nitride films and polysilicon buffer layers have been removed according to one embodiment of the disclosed method.

Next, as shown in FIG. 7 field oxide region 44 may be formed on substrate 20 within field oxide area 40. First "bird's beak" areas 46 are present at the surface of substrate 20, but significantly, no second "bird's beak" exists. Field oxide region 44 may be formed using any suitable method known in the art for forming field oxides, including a wet oxidation process, etc. In one embodiment, thickness of field oxide 44 may be from about 1000 Å to about 10,000 Å, alternatively from about 5000 Å to about 9000 Å.

Figure 8:
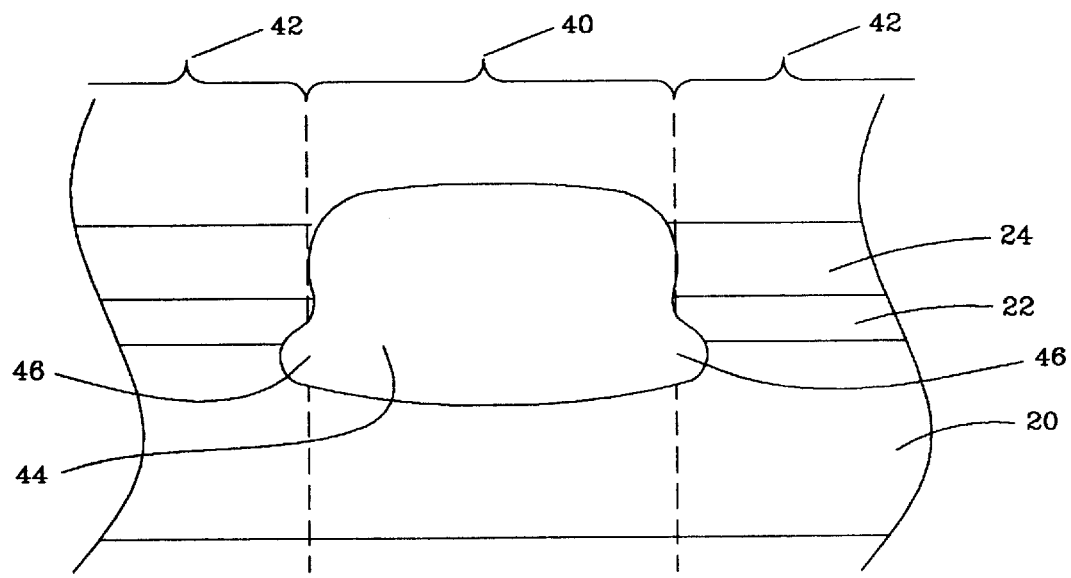
FIG. 8 is a simplified partial cross-sectional view of the semiconductor substrate of FIG. 7 showing doped and undoped silicon nitride films removed over the active areas of the semiconductor substrate according to one embodiment of the disclosed method.
Figure 9:
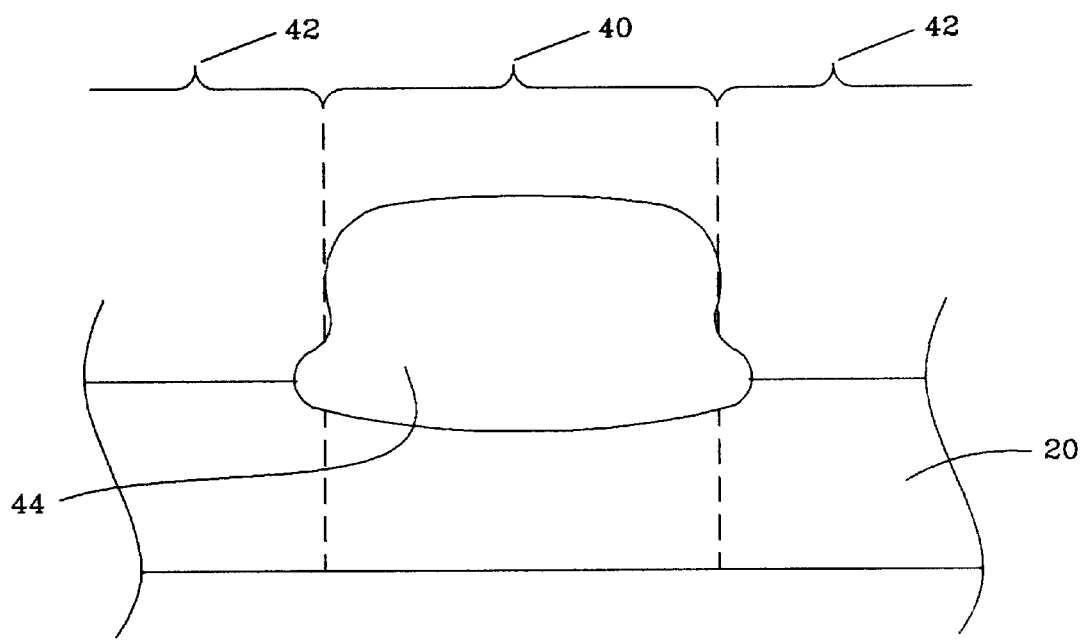
FIG. 9 is a simplified partial cross-sectional view of the semiconductor substrate of FIG. 8 showing polysilicon buffer and oxide pad layers removed over the active areas of the semiconductor substrate according to one embodiment of the disclosed method.

As shown in FIG. 8, following formation of field oxide regions 44, film layers 28 and 26 may be removed in active areas 42 to expose polysilicon buffer layer 24, for example, by chemical etching, HF acid stripping, reactive ion etching, etc. After removal of layers 28 and 26, polysilicon buffer layer 24 and oxide pad layer 22 may be removed in active areas 42, for example, using a dry etching process in one or more steps so as to expose substrate 20 of active region 42, as shown in FIG. 9.

Using embodiments of the disclosed method, nonuniformity of nitridized substrate interfaces may be decreased, resulting in increased process capability. In one exemplary embodiment of the disclosed method, film within wafer thickness nonuniformity (i.e., standard deviation/average wafer thickness) of a nitride treated polysilicon test wafer may be reduced to values as low as about 2% or less, from values of about 7% or more typically seen for surface treatments performed with conventional undoped ammonia plasma treatments.

Table 1 illustrates the difference in film uniformity (i.e., thickness variation) between a standard undoped silicon nitride film formed by conventional ammonia plasma, and a fluorine-doped silicon nitride film formed by a fluorine-doped ammonia plasma, both measured on a 8" bare silicon test wafer, for one embodiment of the disclosed method.

TABLE 1

Standard $NH_3$ Film vs. $C_2F_6$- Doped Film

|  | Standard $NH_3$ Plasma | $C_2F_6$- Doped Plasma |
|---|---|---|
| $C_2F_6$ Flow (sccm) | 0 | 30 |
| Thickness (Å) | 24 | 22 |
| Thickness Variation Range (Å) | 10 | <2 |
| Wet Oxide Growth (Å) | 65 | 65 |

Although one exemplary embodiment of the use of a fluorine-doped nitride surface treatment in the creation of a MOS device using a PBLOCOS process has been described above, it will be understood with benefit of the present disclosure that embodiments of the disclosed method may be beneficially employed in any method and/or for the creation of any device in which increased nitride uniformity and/or suppression of "second bird's beak" formation is desired.

EXAMPLES

The following examples are illustrative and should not be construed as limiting the scope of the invention or claims thereof.

Example 1

$C_2F_6$ Doped Nitride Surface Treatment

Figure 10:
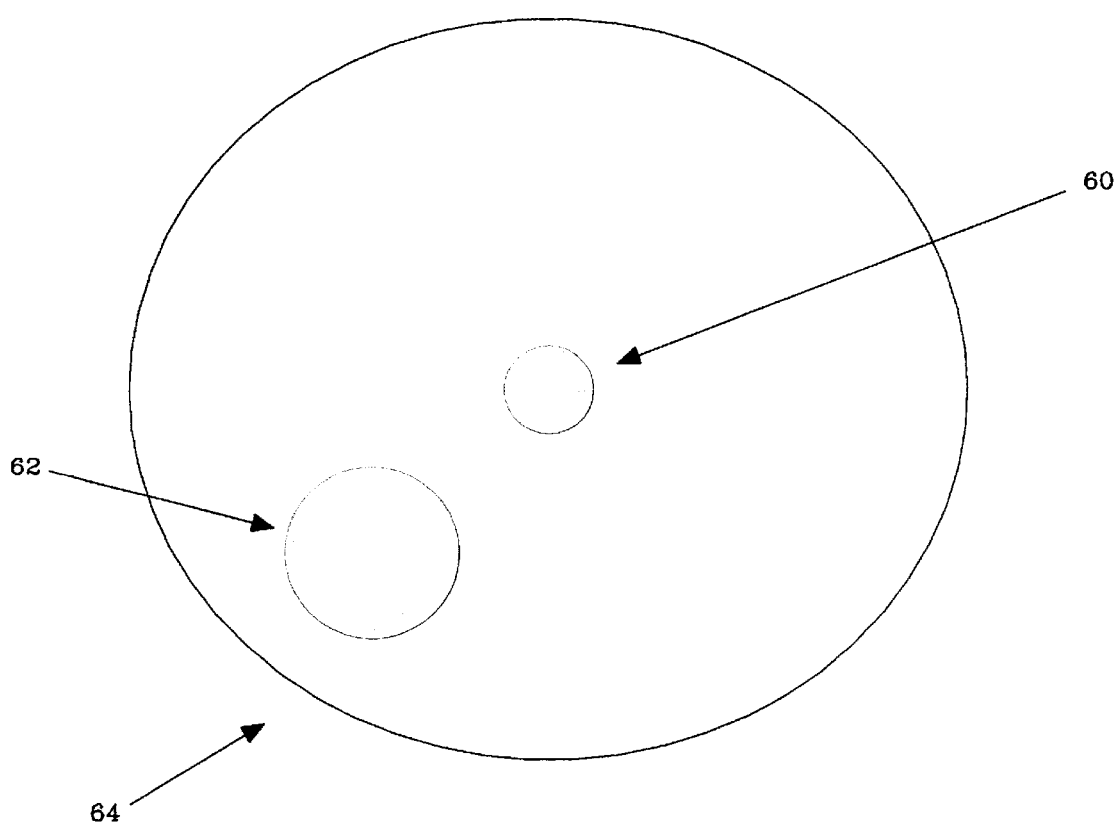
FIG. 10 is a simplified schematic of a plasma-CVD reactor setup used in collecting data for Examples 1–4.

In Example 1, a bare silicon wafer substrate was surface treated using an ammonia PECVD process. FIG. 10 illustrates the reactor set-up utilized, including the spindle pumping area 60, wafer position 62, and pumping area limit 64. The process was conducted in a "NOVELLUS CONCEPT II" reactor. The reactor was modified by replacing the mass flow controllers with smaller units acceptable for controlling carbon hexafluorine gas flows of as low as at least 10 sccm. Ammonia and fluorine gases were introduced through separate flow controllers.

In the various tests of this example, CVD treatment gas flow rates ranged from 100 sccm to 200 sccm of $C_2F_6$, and from 300 sccm to 400 sccm $NH_3$. The plasma recipe used in this example is given in Table 2.

TABLE 2

$C_2F_6$ Doped $NH_3$ Plasma Recipe
(NOVELLUS CONCEPT II Reactor)

| Parameter | Value |
|---|---|
| N2 manifold A (sccm) | 3000 |
| N2 manifold B (sccm) | 3000 |
| $NH_3$ (sccm) | 300 |
| $C_2F_6$ (sccm) | 30 |
| HFRF (watts) | 250 |
| LFRF (watts) | 350 |
| loPr (torr) | 1.9 |
| Pres (torr) | 2 |
| hiPr (torr) | 2 |
| Temp (° C.) | 400 |
| SDT (sec) | 12 ± 5 |
| PCT (sec) | 120 |
| PreA (sec) | 1 |
| PosA (sec) | 0.5 |
| Soak (sec) | 10 |
| LLwt (sec) | 3 |
| flOK (%) | 5 |
| Tem % | 2 |
| TemT (sec) | 1200 |

TABLE 2-continued

C$_2$F$_6$ Doped NH$_3$ Plasma Recipe
(NOVELLUS CONCEPT II Reactor)

| Parameter | Value |
|---|---|
| depR (A/min) | 500 |
| echR (A/min) | 2000 |
| PCER (A/min) | 2000 |
| pRes (torr) | 2.3 |
| SIHE (boolean) | 0 |
| WAIT (sec) | 5 |
| smFF (boolean) | 1 |
| pcLm (A) | 20000 |
| SPCT (sec) | 60 |
| NH$_3$E (boolean) | 1 |
| dfFF (boolean) | 0 |

Thickness and thickness variation was evaluated using a Tencor Instruments "PROMETRIX UV-1250SE." Results are given in Table 3. Abbreviations used in Table 2 and elsewhere herein are defined as follows:

TABLE 3

Initial Test of C$_2$F$_6$ Doped NH$_3$ Plasma

| Slot | C$_2$F$_6$ Flow (sccm) | NH$_3$ Flow (sccm) | *SDT (sec) | Wafer Thickness (Å) | Thickness Range (Å) | Oxide Growth, (Å/minute) | Particles Post Plasma (number) |
|---|---|---|---|---|---|---|---|
| 5 | 100 | 300 | 10.4 | 24.66 | 1.36 | 340 | 1 |
| 6 | 100 | 300 | 10.4 | 24.49 | 1.43 | 340 | 2 |
| 7 | 100 | 300 | 10.4 | 24.16 | 2.18 | | |
| 8 | 100 | 300 | 10.4 | 24.42 | 1.49 | | |
| 9 | 100 | 300 | 10.4 | 24.54 | 1.49 | | |
| 10 | 100 | 300 | 20.4 | 26.29 | 1.58 | | |
| 11 | 100 | 300 | 20.4 | 26.28 | 1.56 | | |
| 12 | 200 | 300 | 10.4 | 19.66 | 3.61 | | |
| 13 | 200 | 300 | 10.4 | 19.31 | 2.69 | | |
| 14 | 100 | 400 | 10.4 | 24.26 | 1.41 | | |
| 15 | 100 | 400 | 10.4 | 24.83 | 1.65 | | |

"SDT" = standard deposition time (seconds)

The results of Example 1 indicate that relatively low flow rates of C$_2$F$_6$ result in more desirable oxide growth rates than higher flow rates.

Example 2

C$_2$F$_6$ Doped Nitride Surface Treatment with Lower Flow Rates of C$_2$F$_6$

In Example 2, lower flow rates of C$_2$F$_6$ in the CVD treatment gas were utilized to examine the effect on nitride thickness range and oxide growth. In this example, carbon hexafluorine flow rates ranged from 0 to 100 sccm, while ammonia flow rate was maintained constant at 300 sccm. The experimental apparatus and test procedure of Example 1 were employed for Example 2.

TABLE 4

Lower C$_2$F$_6$ Flow Rates

| Slot | C$_2$F$_6$ Flow (sccm) | NH$_3$ Flow (sccm) | SDT (sec) | Thickness (Å) | Thickness Range (Å) | Oxide Growth, (Å/minute) |
|---|---|---|---|---|---|---|
| 1 | 100 | 300 | 10.4 | 21.25 | 0.63 | 925 |
| 2 | 100 | 300 | 10.4 | 20.84 | 0.95 | 923 |

TABLE 4-continued

Lower C$_2$F$_6$ Flow Rates

| Slot | C$_2$F$_6$ Flow (sccm) | NH$_3$ Flow (sccm) | SDT (sec) | Thickness (Å) | Thickness Range (Å) | Oxide Growth, (Å/minute) |
|---|---|---|---|---|---|---|
| 3 | 0 | 300 | 10.4 | 25.41 | 9.23 | 110 |
| 4 | 0 | 300 | 10.4 | 25.51 | 9.39 | 113 |
| 5 | 60 | 300 | 10.4 | 22.38 | 0.49 | 850 |
| 6 | 60 | 300 | 10.4 | 22.13 | 0.47 | 834 |

Many defects were observed (using the "Tencor 6220") on the C$_2$F$_6$-doped nitride treated wafers after SiN treatment The defects were actually surface roughness. The particle map matched the 49 pt thickness uniformity map seen after ammonia plasma deposition.

The results of Example 2 indicate that relatively low flows of C$_2$F$_6$ produced desired uniformity benefit while not adversely affecting oxide growth.

Example 3

C$_2$F$_6$ Doped Nitride Surface Treatment with Lower Flow Rates and with D-FEG Setup In Example 3, the procedure of Example 2 was repeated, this time using a dual frequency e-ground ("D-FEG") reactor setup. Results of Example 3 are shown in Table 5. In this example, carbon hexafluoride flow rates ranged from 0 sccm to 30 sccm while ammonia flow rate was maintained at 300 sccm.

TABLE 5

Lower C$_2$F$_6$ Flow Rates with D-FEG Setup

| Slot | C$_2$F$_6$ Flow (sccm) | NH$_3$ Flow (sccm) | SDT (sec) | Thickness (Å) | Thickness Range (Å) | Oxide Growth, (Å/minute) (Avg./Max.) |
|---|---|---|---|---|---|---|
| 1 | 0 | 300 | 8.5 | 25.49 | 6.65 | 88/340 |
| 2 | 0 | 300 | 8.5 | 25.64 | 7.35 | 83/291 |
| 3 | 30 | 300 | 8.5 | 21.25 | 1.39 | 68/117 |
| 4 | 30 | 300 | 8.5 | 20.84 | 1.48 | 65/104 |

The results of this example indicate that maximum oxide growth rate was lower when C$_2$F$_6$ was introduced at the rates indicated.

Figure 11:
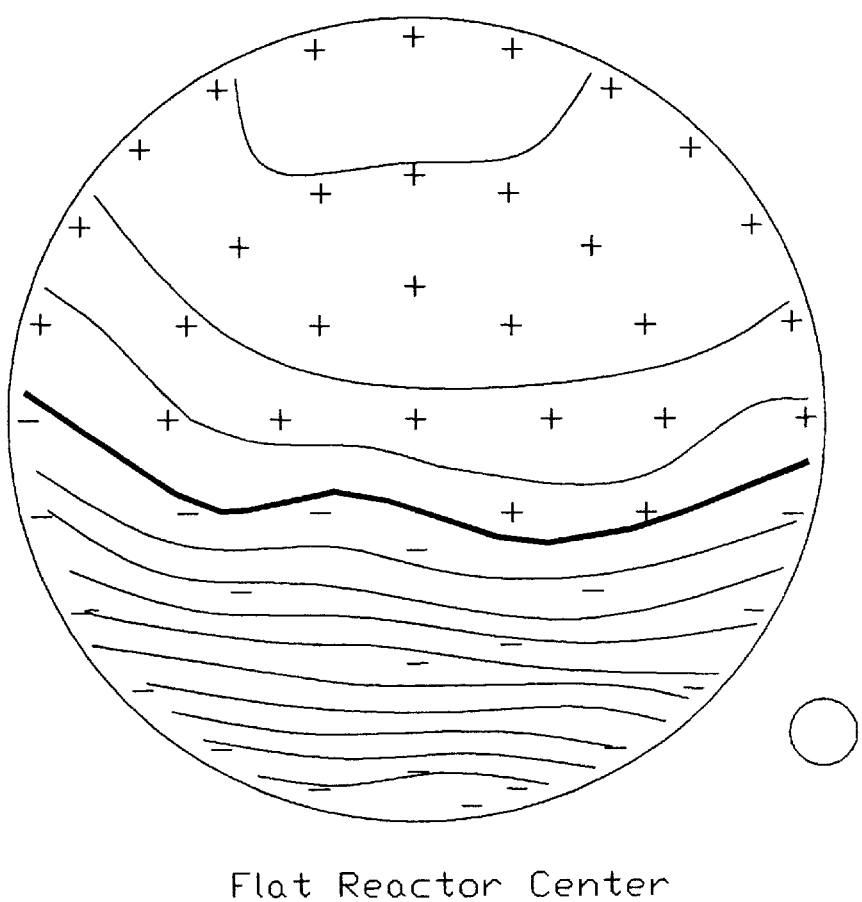
FIG. 11 is a contour map of silicon nitride film thickness for the wafer of slot 1 of Example 3.
Figure 12:
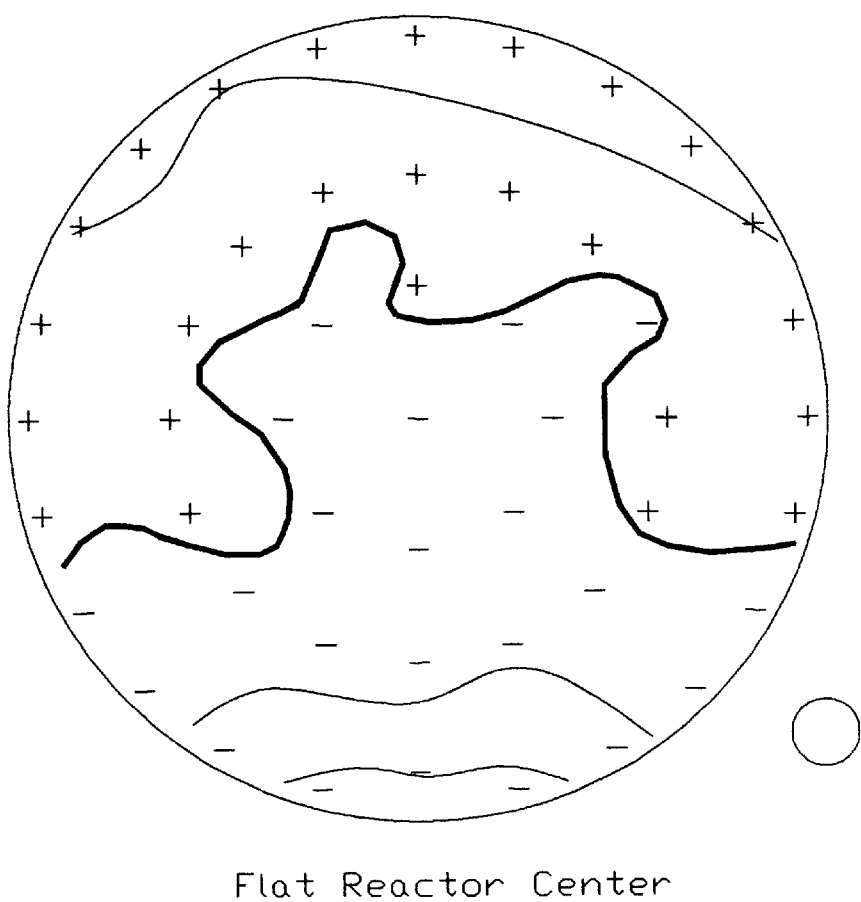
FIG. 12 is a contour map of silicon nitride film thickness for the wafer of slot 3 of Example 3.

FIGS. 11 and 12 are contour maps of silicon nitride film thickness for the wafers of slots 1 and 3, respectively. As may be seen by the contour maps, the wafer of slot 3 (surface treated with fluorine-doped ammonia plasma) exhibited a within-wafer thickness variation range of only 1.39 Å over a wafer mean film thickness of 24.19 Å, and had a standard deviation of 0.3329 Å, giving a wafer thickness nonuniformity of 1.376%. This is much more uniform than the 6.65 Å within-wafer thickness range exhibited by the wafer of slot 1 (surface treated with conventional undoped ammonia plasma), which had a mean thickness of 25.49 Å, a standard deviation of 1.9669 Å, and a wafer thickness nonuniformity of 7.717%.

The film uniformity results of Examples 2 and 3 show that a much more uniform interface between the substrate and nitride is achieved when a nitridized interface is created using a fluorine doped ammonia plasma surface treatment. These results also suggest that there is a residence time factor that is not as important when carbon hexafluoride is present in the treatment gas. While not wishing to be bound by theory, such a factor could be a mechanism related to mass transport of reactant ions to the surface, or removal of byproducts. In addition it is possible that highly electronegative fluoride ions modify the ammonia plasma by scavenging hydrogen to form HF, and thus allowing a higher density for reaction with the silicon.

While the invention may be adaptable to various modifications and alternative forms, specific embodiments have been shown by way of example and described herein. However, it should be understood that the invention is not intended to be limited to the particular forms disclosed. Rather, the invention is to cover all modifications, equivalents, and alternatives falling within the spirit and scope of the invention as defined by the appended claims. Moreover, the different aspects of the disclosed compositions and methods may be utilized in various combinations and/or independently. Thus the invention is not limited to only those combinations shown herein, but rather may include other combinations.

What is claimed is:

1. A method of depositing a substantially uniform fluorine-doped nitridized layer on an upper surface of a substrate in a chemical vapor deposition process, comprising:

exposing a surface of the substrate to a gas mixture comprising a fluorine-containing gas provided at a first steady flow rate and a nitrogen-containing gas provided at a second steady flow rate for a period of time sufficient enough to form a fluorine-doped nitridized layer having an interface with the substrate surface.

2. The method of claim 1, wherein said substrate surface comprises silicon dioxide.

3. The method of claim 1, wherein said substrate surface comprises polysilicon.

4. The method of claim 1, wherein the nitrogen-containing gas is at least one of ammonia, nitrogen, or a mixture thereof; wherein the fluorine-containing gas is at least one of $C_2F_6$, $C_3F_8$, $CF_4$, or a mixture thereof; and wherein said exposing the substrate surface to the gas mixture occurs in a low pressure plasma enhanced chemical vapor deposition process.

5. The method of claim 1, wherein the nitrogen-containing gas is ammonia; wherein the fluorine-containing gas is carbon hexafluoride; and wherein said exposing the substrate surface to the gas mixture occurs in a low pressure plasma enhanced chemical vapor deposition process.

6. The method of claim 1, further comprising exposing the fluorine-doped nitridized layer to an undoped treatment gas comprising a nitrogen component for a period of time sufficient enough to form an undoped nitridized layer on the fluorine-doped nitridized layer.

7. The method of claim 6, wherein the nitrogen-containing gas of the doped gas mixture is ammonia; wherein the fluorine-containing gas of the doped gas mixture is carbon hexafluoride; wherein the nitrogen component of the undoped treatment gas is ammonia; and wherein said exposing the substrate surface to the doped gas mixture and said exposing the fluorine-doped nitridized layer to the undoped treatment gas each occurs in a respective low pressure plasma enhanced chemical vapor deposition process.

8. The method of claim 5, wherein the fluorine-doped nitridized layer comprises a thickness within the range of about 1 Å to about 40 Å.

9. The method of claim 5, wherein the fluorine-doped nitridized layer comprises a thickness within the range of about 10 Å to about 30 Å.

10. The method of claim 5, wherein the doped gas mixture comprises a gas flow rate ratio of carbonhexafluoride to ammonia that is within the range of about 1:1 to about 1:20.

11. The method of claim 6, wherein the fluorine-doped nitridized layer comprises a thickness of from about 1 Å to about 40 Å; and wherein the undoped nitridized layer comprises a thickness within the range of about 700 Å to about 3000 Å.

12. The method of claim 7, wherein the substrate comprises a semiconductor wafer, and wherein the undoped nitridized layer has a within wafer thickness variation of less than about 2 Å.

* * * * *